United States Patent [19]

Burkhardt et al.

[11] 4,229,646
[45] Oct. 21, 1980

[54] ELECTRONIC COUNTER FOR INCREMENTAL MEASURING DEVICE

[75] Inventors: Horst Burkhardt, Truchtlaching; Ernst Schwefel, Traunreut; Alfons Baumgartner, Grassau; Anton Mayer, Fridolfing; Michael Rauth, Traunreut, all of Fed. Rep. of Germany

[73] Assignee: Johannes Heidenhain GmbH, Traunreut, Fed. Rep. of Germany

[21] Appl. No.: 923,807

[22] Filed: Jul. 12, 1978

[30] Foreign Application Priority Data

Jul. 21, 1977 [DE] Fed. Rep. of Germany ....... 2732954

[51] Int. Cl.³ .............................................. G06M 3/14
[52] U.S. Cl. ........................... 235/92 GC; 235/92 FP; 235/92 PL; 235/92 MP; 250/237 G
[58] Field of Search ....... 235/92 GC, 92 DN, 92 MP, 235/92 CP, 92 PL, 92 EV, 92 PE; 250/237 G

[56] References Cited

U.S. PATENT DOCUMENTS

| 3,965,340 | 6/1976 | Renner et al. ................. 235/92 CP |
| 3,982,106 | 9/1976 | Stutz .............................. 235/92 PL |
| 4,049,951 | 9/1977 | Baty et al. ..................... 235/92 MP |
| 4,051,913 | 10/1977 | Gudea ............................ 235/92 DP |

FOREIGN PATENT DOCUMENTS

| 1200521 | 7/1970 | United Kingdom. |
| 1277985 | 6/1972 | United Kingdom. |
| 1389253 | 4/1975 | United Kingdom. |
| 1491531 | 9/1977 | United Kingdom. |
| 1511818 | 5/1978 | United Kingdom. |

*Primary Examiner*—Joseph M. Thesz
*Attorney, Agent, or Firm*—Hume, Clement, Brinks, Willian & Olds, Ltd.

[57] ABSTRACT

An improved counter for use with an incremental measuring device is disclosed which includes an up-down counter, a plurality of memory units, a computer, and means for designating any of the memory units. The computer is coupled to the counter and the memory units and is programmed to algebraically combine the value stored in the counter with the value stored in the designated memory unit to generate an output value for display. In the preferred embodiment, circuits are provided for setting the individual memory units to preselected values. The counter of this invention can be used to selectively display the measured position in any one of several measurement modes by designation of the appropriate memory unit.

21 Claims, 2 Drawing Figures

ELECTRONIC COUNTER FOR INCREMENTAL MEASURING DEVICE

BACKGROUND OF THE INVENTION

This invention relates to an improved electronic counter for use with incremental measuring devices of the type used for positioning or measuring the relative position of two parts of a machine or the like. The aforementioned parts may be the slide and the bed of a tooling or measuring machine, for example.

Incremental measuring devices are commonly designed to operate in several different measuring modes, generally including an absolute measurement mode and at least one relative measurement mode. In the absolute mode the zero point for the measurement is provided by a fixed reference mark on the measuring device, a machine zero point, and all measurements are made with respect to this reference mark. In the relative mode the zero point for the measurement is arbitrarily set at a convenient point and measurements are made relative to the particular zero point in use at any given time. Incremental angle and position measuring devices of the prior art are subject to errors introduced when the device is alternately used in the absolute and relative measuring modes.

SUMMARY OF THE INVENTION

The present invention is directed to an improved electronic counter for incremental measuring devices that combine only a small number of electronic components and permits any of a plurality of measuring or positioning modes to be employed without introducing errors into the measurement. This improved counter is versatile, easy to operate, and dependable.

The improved counter of this invention includes an up-down counter, a computer, and at least one electronic memory unit. The computer has access to the contents of the up-down counter and at least one reference point switch is provided. This switch can be used to select any one of a plurality of measurement modes. In each switch position a predetermined memory unit is selected. The computer is programmed to algebraically combine the contents of the selected memory unit with the instantaneous contents of the up-down counter to generate a number representative of the measured position in the selected measurement mode. This computer generated number is then output for display on a conventional indicator.

In a preferred embodiment of this electronic counter the reference point switch is provided with at least two positions. On selection of the first position the displayed number indicates the measured position in an absolute measurement mode, i.e., the computer generated number is equal to the contents of the up-down counter. On selection of the second position the displayed number indicates the measured position in a relative measurement mode, i.e., the displayed number is equal to the contents of the up-down counter minus a stored value.

According to a further feature of the invention, erasing the setting switches are provided which act only on the computer and not on the up-down counter. On operation of the erasing key the instantaneous contents of the up-down counter are stored in the memory unit selected by the reference point switch, and on operation of the setting key the instantaneous contents of the up-down counter minus the contents of a setting register are stored in the preselected memory unit.

Further features of the invention are set forth in the claims.

The present invention offers the following important advantages:

1. When sufficient memory units are used an arbitrarily large number of measurement modes (zero points) can be provided with only a single electronic up-down counter. The zero point for individual reference modes may be easily changed without disturbing the contents of the up-down counter and without necessitating recalibration of the up-down counter.

2. Either an absolute measurement mode referenced to a preselected zero point or one or more relative measurement modes can be selected at will. An operator can select between any of several separate reference systems, and several reference systems can be maintained simultaneously.

3. The counter is versatile and simple to operate, and compact in size.

4. The computer of the counter, which is preferably a microprocessor, can be used to carry out other computing operations, for example, performing conversions from one measurement system to another and generating the algebraic sign of the displayed value.

The invention, together with further objects and attendant advantages, will be best understood by reference to the description which follows, taken in conjunction with the accompanying drawings.

DETAILED DESCRIPTION OF PREFERRED EMBODIMENTS

Figure 1:
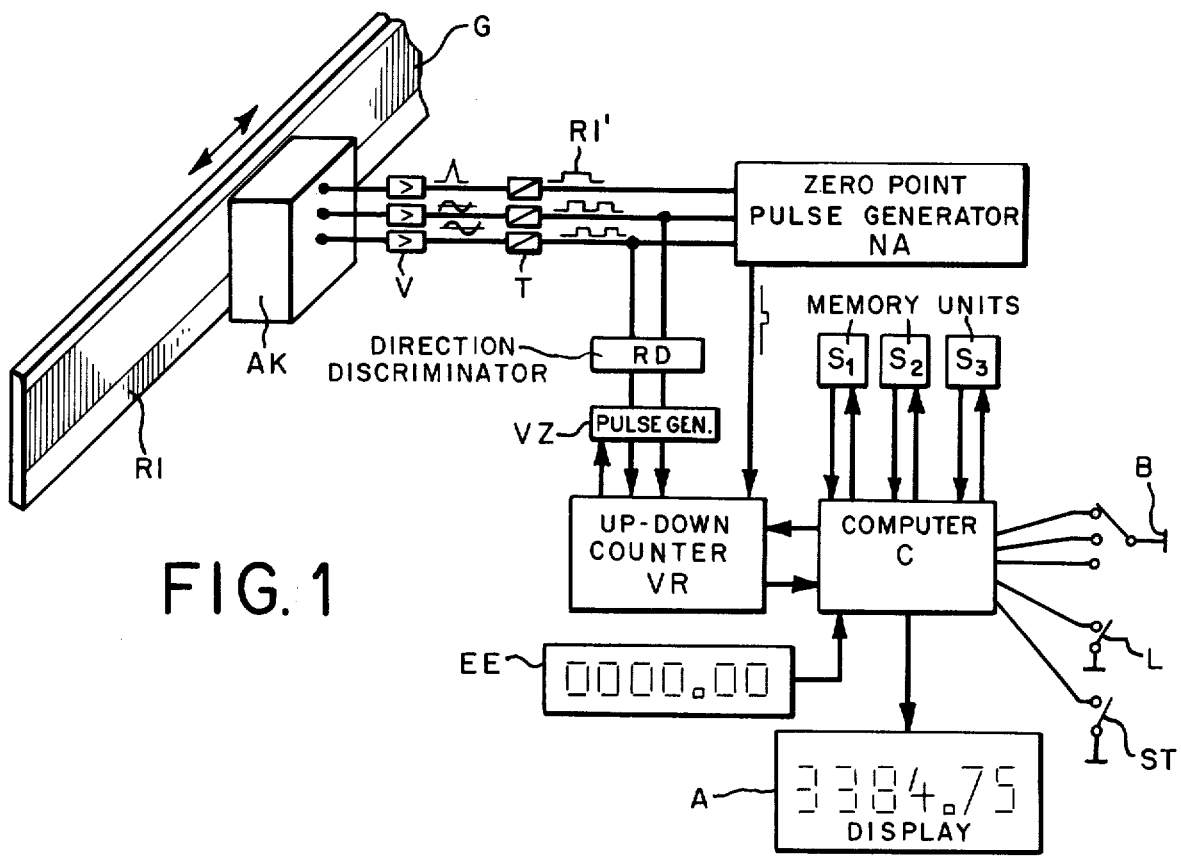
FIG. 1 is a block circuit diagram of a first preferred embodiment of the improved counter of this invention.

Referring now to the drawings, FIG. 1 depicts an incremental measuring device for measuring the relative position of two objects. This device includes a grid scale G and a scanning head AK which generates position dependent signals which are amplified in a known manner in amplifiers V and triggered in trigger circuits T. The pulsed outputs of the trigger circuits T are supplied to a direction discriminator RD which in turn controls a pulse generator VZ. The pulses thereby generated are counted in an up-down counter VR. A so-called zero pulse track RI on the grid scale G delivers a reference signal RI', whose position is absolutely established with respect to the grid scale G of the measuring system. This reference signal RI' is amplified and shaped by a trigger circuit, and then applied to a zero point pulse generator NA. The up-down counter VR constantly counts the impulses delivered by the measuring system.

A digital computer C, which in this embodiment preferably includes a microprocessor, includes memory units $S_1, S_2, S_3$ and is coupled to the up-down counter VR so the computer C can sample the contents of the counter VR. A reference point switch B is provided to permit selection of any one of the memory units $S_1, S_2$, or $S_3$. The computer C is programmed to sample the contents of the counter VR and the selected memory unit $S_1, S_2, S_3$ and to subtract the value stored in the selected memory unit from the contents of the counter VR to generate a difference value. This difference value is output by the computer C for display on an indicator A. The position of the reference point switch B can be changed at will, so that in conjunction with the memory units $S_1, S_2, S_3$ any of several reference points can be selected for the displayed difference value.

In order to be able to store different values in the memory units $S_1, S_2, S_3$, an erasing key L and a setting key ST are preferably provided. These keys act only on the computer C. The computer C is programmed to transfer the instantaneous contents of the counter VR into the memory unit $S_1$, $S_2$, or $S_3$ that has been selected with the reference point switch B on operation of the erasing key L. Since the computer C is programmed to form the difference between the contents of the counter and the value stored in the selected memory unit, the indicator A shows "0" at this moment. In this manner a reference or zero point can be created. If the measuring system now transmits further impulses to the counter VR, as for instance when the grid G moves relative to the scanning unit AK, the computer C forms the difference of new counter state and the stored value and outputs this difference value for display. This difference value is the value that corresponds to the relative movement of the grid scale G since the operation of the erasing key L. Through repeated operation of the erasing key L the value stored in a preselected memory unit $S_1, S_2$, or $S_3$ can be erased and a new reference value stored. In this manner any desired reference point can be created. Depending on the number of memory units $S_1, S_2, S_3$ and the corresponding number of positions of the reference point switch B, a variety of reference points can be formed which are selectable and recallable through appropriate positioning of the reference point switch B.

The counter according to the present invention can generate reference points at arbitrarily selected positions that are recallable at any time and whose number is restricted only by the storage capacity. This feature can be used very advantageously, for example, in chain scalings.

An improvement of the counter according to the invention is provided by the setting key ST. On operation of the setting key ST an arbitrary setting value previously selected on an input register EE is processed in the computer C in such a way that the contents of the counter minus the setting value is stored in a preselected memory unit $S_1, S_2$, or $S_3$. Again the displayed value in the display unit A is calculated by the computer and is equal to the difference between the contents of the counter VR and the value stored in the selected memory unit.

In the preferred embodiment shown in FIG. 1, one position of the reference point switch B causes the computer to display the absolute position of the object to be positioned. In this measurement mode the displayed value is equal to the instantaneous contents of the counter. The reference pulse RI' is used to repeatedly calibrate the counter VR and to maintain the zero point of the measurement at the machine zero point. The reference pulse RI' is evaluated for this in the zero point pulse generator NA and supplied to the counter VR. Of course, measurement modes based on other reference points than this absolute reference point can be selected at any time through alternate positions of the reference point switch B.

Further, in the counter of this invention it is possible in a simple manner to correct errors that are present, for example, in the guides of the objects being positioned or in the grid scale G of the measuring system. Permanently stored correction values determined by a special measurement can be allocated to absolute position values, and these correction values can be computationally taken into account by the computer C.

The absolute position values mentioned can be located at any time with the aid of coded reference marks RI (code track not represented) of the grid scale G and can be acted upon with the correction values mentioned, so that the counter state is corrected for these absolute position values. To each absolute position value there is allocated a previously determined correction value that is stored in a predetermined location in computer memory. The information of the reference marks RI of the aforementioned code track is preferably decoded in the computer C.

It is advantageous to provide further in this counter an internal voltage supply such as a battery or an accumulator, which supplies power to both the measuring system and the computer C so that the contents of the counter VR and the computer program may be accurately maintained during power failures.

Figure 2:
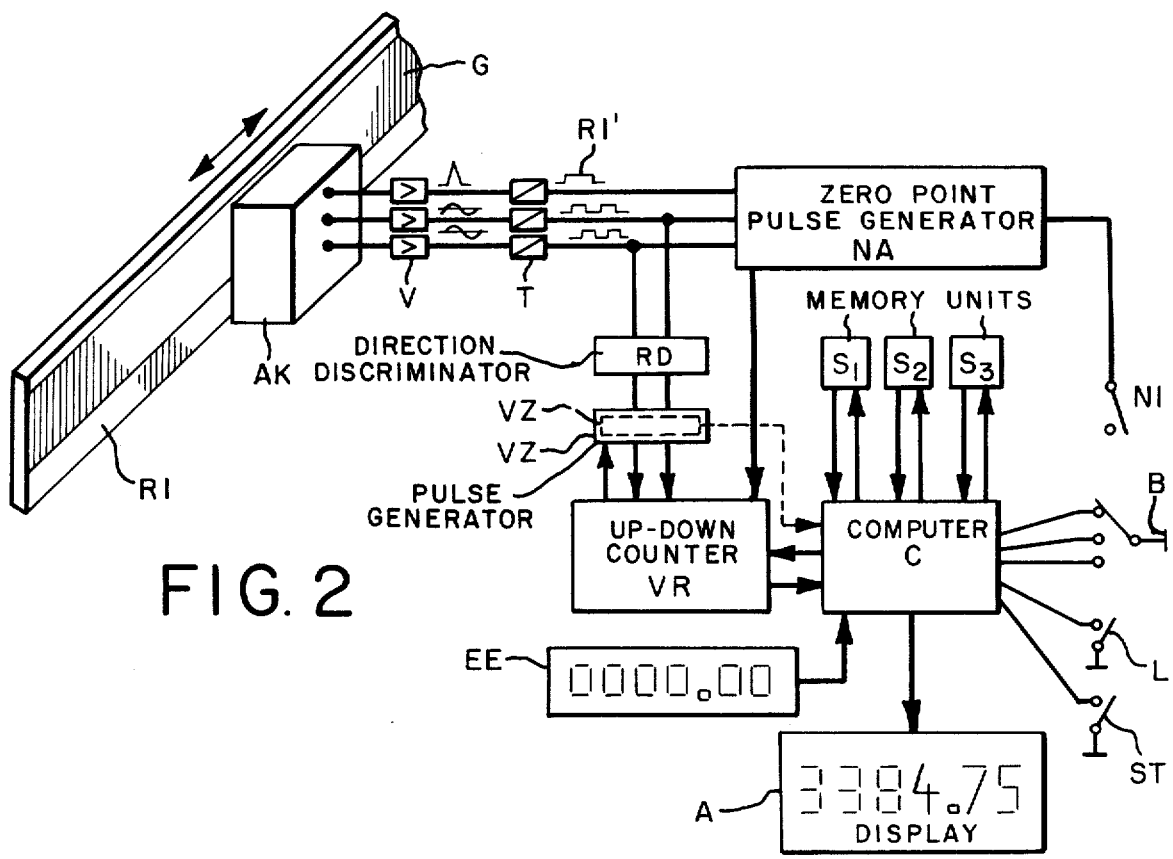
FIG. 2 is a block diagram of a second preferred embodiment of the improved counter of this invention.

FIG. 2 shows a block circuit diagram of a second embodiment of the electronic counter of this invention. This second embodiment provides the freely selectable reference points and the possibility of storing certain stored values by means of the setting key ST as in the first preferred embodiment. In addition, it is also possible at any time to select an absolute zero or reference pulse RI' by means of a zero pulse switch NI and to utilize this pulse to stop or start the counter VR. When the counter VR is in the stopped state the erasing or setting process can occur, that is, the computer C can store the contents of the counter on operation of the erasing key L and the contents of the counter minus the setting value on operation of the setting key ST in a preselected memory unit $S_1, S_2$, or $S_3$, without alteration of the reference points in the other reference systems determinable by the switch position.

Other calculations can easily be carried out with the computer C. For example, the computer C can be programmed to convert position values from one measurement system to another or to generate the algebraic sign of the displayed value.

The electronic counter of this invention can advantageously be used also in a numerically controlled machine tool. Of course, it should be understood that various changes and modifications to the preferred embodiments described herein will be apparent to those skilled in the art. Such changes and modifications can be made without departing from the spirit and scope of the present invention and without diminishing its attendant advantages. It is, therefore, intended that such changes and modifications be covered by the following claims.

We claim:

1. An apparatus for a measuring device for measuring the position of a first object relative to a second object, said apparatus comprising:
   counter means for storing a position value representatives of the position of the first object;
   at least one memory means for storing a predetermined reference point value;
   means for selectively designating the memory means, including switch means having at least a first state and a second state;
   computing means, coupled to the counter means, the memory means, and the designating means, for generating an output value;

first means, included in the computing means, for setting the output value to correspond to the position value when the switch means is in the first state; and second means, included in the computing means, for setting the output value to correspond to the position value algebraically combined with the reference point value stored in the at least one memory means when the switch means is in the second state.

2. The apparatus of claim 1 wherein the switch means includes a reference point switch having at least a first and second position, and further, wherein the first means sets the output value equal to the position value stored in the counter means when the switch is in the first position and sets the output value equal to the position value stored in the counter means minus the reference point value stored in the memory means when the switch is in the second position.

3. The apparatus of claim 2 wherein the computing means further includes means for storing a plurality of correction values and the computing means is further programmed to numerically correct the position value stored in the counter means with the plurality of correction values.

4. The apparatus of claim 3 further including means for indicating a plurality of absolute positions of the first object with respect to the second object wherein the computing means is programmed to allocate a preselected correction value to each of the plurality of absolute positions, and further, wherein the computing means is programmed to detect the indication of each absolute position indicated by the indicating means and to store the associated correction value in the counter means.

5. The apparatus of claim 2 wherein the computing means and the memory means are normally powered by an external power supply and futher including an internal power supply for supplying power to the computing means and the memory means in the event of failure of the external power supply.

6. The apparatus of claims 1 or 2 wherein the computing means further includes an erasing key, a setting key, and a register for storing a setting value, and the computer means is programmed to store the position value stored in the counter means in the designated memory means on operation of the erasing key and to store the position value stored in the counter means minus the setting value stored in the register in the designated memory means on operation of the setting key.

7. The apparatus of claim 6 further including means for generating a signal at a predetermined position of the first object with respect to the second object and means for stopping the counter means in response to the signal generating means in order to permit accurate setting of the memory unit by operation of the erasing and setting keys.

8. The apparatus of claim 1 or 2 further including means for generating a signal at a predetermined position of the first object with respect to the second object and means for storing a predetermined position value in the counter means in response to the signal generating means.

9. The apparatus of claim 8 wherein the computing means further includes means for storing a plurality of correction values and the computing means is further programmed to numerically correct the position value stored in the counter means with the plurality of correction values.

10. The apparatus of claim 8 further including means for indicating a plurality of absolute positions of the first object with respect to the second object wherein the computing means is programmed to allocate a preselected correction value to each of the plurality of absolute positions, and further, wherein the computing means is programmed to detect the indicating of each absolute position indicated by the indicating means and to store the associated correction value in the counter means.

11. The apparatus of claims 1, 2, 3, or 4 wherein the computing means is further programmed to convert the output value from a first unit of measurement to a second unit of measurement and to form the algebraic sign of the output value.

12. The apparatus of claim 1 or 2 wherein the computing means includes a microprocessor.

13. The apparatus of claims 1 or 2 wherein the measuring device is used in conjunction with a numerically controlled machine.

14. In a measuring device for measuring the position of a first object relative to a second object, the improvement comprising:

means for storing a position value representative of the position of the first object;

means for storing a reference frame offset value;

means for selectively designating a first reference frame and a second reference frame;

computing means, coupled to the position value storing means, the offset value storing means, and the designating means, for generating an output value;

first means, included in the computing means, for setting the output value to correspond to the position value when the first reference frame is designated; and second means, included in the computing means, for setting the output value to correspond to the position value algebraically combined with the offset value when the second reference frame is designated.

15. The improvement of claim 14 wherein the first means operates to set the output value equal to the position value and the second means operates to set the output value equal to the difference between the position value and the offset value.

16. The improvement of claim 14 further including:

means for storing a setting value;

a setting switch; and means, included in the computing means, for storing the difference between the positon value and the setting value in the means for storing the offset value on actuation of the setting switch.

17. The improvement of claim 14 or 15 or 16 further including:

an erasing switch; and means, included in the computing means, for storing the position value in the means for storing the offset value on actuation of the erasing switch.

18. In a measuring device for measuring the position of a first object relative to a second object, the improvement comprising:

means for storing a position value representative of the position of the first object;

means for storing a first reference frame offset value;

means for storing a second reference frame offset value;

means for selectively designating a first reference frame and a second reference frame;

computing means, coupled to the position value storing means, the first and second offset value storing means, and the designating means, for generating an output value;

first means, included in the computing means, for setting the output value to correspond to the position value algebraically combined with the first offset value when the first reference frame is designated;

second means, included in the computing means, for setting the output value to correspond to the position value algebraically combined with the second offset value when the second reference frame is designated.

19. The improvement of claim 18 wherein the first means operates to set the output value to the difference between the position value and the first offset value and the second means operates to set the output value to the difference between the position value and the second offset value.

20. The improvement of claim 18 further including:
means for storing a setting value;
a setting switch; and
means included in the computing means, for storing the difference between the position value and the setting value in the means for storing the first offset value on actuation of the setting switch.

21. The improvement of claim 18 or 19 or 20 further including:
an erasing switch; and
means, included in the computing means, for storing the position value in the means for storing the first offset value on actuation of the erasing switch.

* * * * *